United States Patent
Lin et al.

(10) Patent No.: US 10,229,747 B2
(45) Date of Patent: Mar. 12, 2019

(54) DISPLAY PANEL AND GATE DRIVING CIRCUIT THEREOF

(71) Applicants: HANNSTAR DISPLAY (NANJING) CORPORATION, Nanjing (CN); HANNSTAR DISPLAY CORPORATION, Taipei (TW)

(72) Inventors: Sung-Chun Lin, Tainan (TW); Hsuan-Chen Liu, Kaohsiung (TW); Chien-Ting Chan, Tainan (TW)

(73) Assignees: HANNSTAR DISPLAY (NANJING) CORPORATION, Nanjing (CN); HANNSTAR DISPLAY CORPORATION, Taipei (TW)

( * ) Notice: Subject to any disclaimer, the term of this patent is extended or adjusted under 35 U.S.C. 154(b) by 164 days.

(21) Appl. No.: 15/237,158

(22) Filed: Aug. 15, 2016

(65) Prior Publication Data

US 2017/0076819 A1    Mar. 16, 2017

(30) Foreign Application Priority Data

Sep. 11, 2015 (CN) .......................... 2015 1 0577826

(51) Int. Cl.
  *G09G 3/36* (2006.01)
  *G11C 19/28* (2006.01)
  *G09G 3/20* (2006.01)

(52) U.S. Cl.
  CPC .......... *G11C 19/28* (2013.01); *G09G 3/2092* (2013.01); *G09G 2300/08* (2013.01); *G09G 2310/0267* (2013.01)

(58) Field of Classification Search
  CPC ... G09G 2310/0286; G09G 2300/0408; G09G 2300/0426; G09G 3/3266; G09G 3/3283;
  (Continued)

(56) References Cited

U.S. PATENT DOCUMENTS

2011/0147844 A1    6/2011  Smith
2016/0202534 A1 *  7/2016  Chen ..................... G02F 1/1339
                                                    349/43

(Continued)

FOREIGN PATENT DOCUMENTS

CN    104460156 A    3/2015
CN    104597638 A    5/2015

OTHER PUBLICATIONS

SIPO. Office Action. dated Dec. 17, 2018. 8 pages.

*Primary Examiner* — Duc Q Dinh
(74) *Attorney, Agent, or Firm* — Muncy, Geissler, Olds & Lowe, P.C.

(57) ABSTRACT

The present invention relates to a display panel and a gate driving circuit of the display panel. The gate driving circuit is disposed on a first substrate and includes a first transistor unit. The first transistor unit is disposed on the first substrate and includes a first gate block, a second gate block, and a first connection portion. The first connection portion is electrically connected to the first gate block and the second gate block. At least a gap is formed between the first gate block and the second gate block. The display panel includes the first substrate, the gate driving circuit, a second substrate, and a sealant. The second substrate is disposed corresponding to the first substrate. The sealant is formed between the first substrate and the second substrate.

18 Claims, 9 Drawing Sheets

(58) Field of Classification Search
CPC ..... G09G 2310/0267; G09G 2310/027; G09G
2300/0814; G09G 2310/0205; G09G
2310/0232; G09G 2310/0289; G09G
2320/0247; G09G 2300/0838; G09G
2310/0275; G09G 3/3674; G09G
2310/0291; G06F 3/044; G06F
2203/04112; G06F 3/0412; G06F
2203/04103; G06F 3/0416; G06F 1/1616;
G06F 1/1637; G06F 1/1652; G06F
2203/04102; G06F 3/012; G06F 3/013;
G06F 1/1641; G06F 1/1647; G06F
1/1654; G06F 1/1681; G06F 2203/04107;
G06F 2203/04111; G06F 17/5054; G06F
1/1618; G06F 1/1626; G06F 1/163; G06F
1/1643; G06F 1/1698; G06F 1/3265
USPC ............................................ 345/87–102, 204
See application file for complete search history.

(56) References Cited

U.S. PATENT DOCUMENTS

2016/0232866 A1\* 8/2016 Cho ..................... H03K 17/56
2016/0349584 A1\* 12/2016 Chen .................... H01L 27/124

\* cited by examiner

DISPLAY PANEL AND GATE DRIVING CIRCUIT THEREOF

BACKGROUND OF THE INVENTION

1. Field of the Invention

The present invention relates to a driving circuit; particularly, the present invention relates to a gate driving circuit with transmittance-enhancement design and a display panel having the gate driving circuit.

2. Description of the Prior Art

A display device generally includes a thin-film transistor substrate, a color filter substrate, a backlight module, an optical film, as well as a gate driving circuit and a data driving circuit for driving transistors of pixels. With technology improvement, the gate driving circuit of the display device can be directly formed on the thin-film transistor substrate to increase production efficiency and meet requirements of narrow frame products.

However, because the gate driving circuit formed on the thin-film transistor substrate overlaps with a sealant between corresponding upper and lower substrates, the gate driving circuit will block light from reaching the sealant during a sealant curing process and lead to incomplete curing of the sealant. As such, water vapor will pass through the incompletely cured sealant and corrode the gate driving circuit, which will then lead to the gate driving circuit malfunctioning. Therefore, there is still room for improvement of the structure of present-day display devices.

SUMMARY OF THE INVENTION

It is an object of the present invention to provide a gate driving circuit which increases the light transmittance of the gate driving circuit.

In an embodiment, the gate driving circuit is disposed on a first substrate and includes a first transistor unit. The first transistor unit is disposed on the first substrate and includes N1 number of gate blocks (N1≥2) and at least one connection portion electrically connected adjacent ones of gate blocks. At least one gap is formed between the adjacent ones of the gate blocks.

In an embodiment, the adjacent ones of the gate blocks and the connection portion electrically connected thereto form a H-shaped, ⊓-shaped, or ⊔-shaped structure.

In an embodiment, the number of the gap between the adjacent ones of gate blocks is two, and the two gaps are located at two sides of the connection portion.

In an embodiment, the material of the connection portion and the material of the gate blocks are the same.

In an embodiment, the material of the connection portion and the material of the gate blocks comprise metal.

In an embodiment, a plurality of transistors of pixels are disposed on the first substrate, while the connection portion, the gate blocks, and the gates of the plurality of transistors of pixels are formed with the same manufacture process.

In an embodiment, the first transistor unit further comprises a plurality of drain lines and a plurality of source lines formed on the gate blocks, while the plurality of drain lines are electrically connected to each other and the plurality of source lines are electrically connected to each other.

In an embodiment, the gate driving circuit includes a plurality of signal lines disposed on the first substrate, and at least a void is formed on at least one of the plurality of signal lines.

In an embodiment, the void has a shape of a stripe, a zigzag, or circle.

In an embodiment, the plurality of signal lines extends along a first direction; the first connection portion extends along a second direction; the first direction is substantially perpendicular to the second direction.

In an embodiment, the gate driving circuit includes a second transistor unit, a third transistor unit, and a fourth transistor unit, wherein the first transistor unit, the second transistor unit, the third transistor unit, and the fourth transistor unit are disposed along a first direction; the N1 number of gate blocks of the first transistor unit are disposed along a second direction; the second transistor unit comprises N2 number of gate blocks (N2≥2) disposed along the second direction and at least one connection portion electrically connects adjacent ones of the N2 number of gate blocks; the third transistor unit comprises N3 number of gate blocks (N3≥2) disposed along the second direction and at least one connection portion electrically connects adjacent ones of the N3 number of gate blocks; the fourth transistor unit comprises N4 number of gate blocks (N4≥2) disposed along the second direction and at least one connection portion electrically connects adjacent ones of the N4 number of gate blocks; wherein the first direction is substantially perpendicular to the second direction; the gate blocks of the first transistor unit, the second transistor unit, the third transistor unit, and the fourth transistor unit together form a ⊐-shaped or a ⊏-shaped structure.

In an embodiment, the number N1 is larger than N2, and N4 is larger than N3.

In an embodiment, an indentation area of the ⊐-shaped or the ⊏-shaped structure is an area without any gate blocks.

In an embodiment, a display panel includes a first substrate, a gate driving circuit, a second substrate, and a sealant. The first transistor unit of the gate driving circuit is disposed on a first substrate. The second substrate is disposed corresponding to the first substrate. The sealant is disposed between the first substrate and the second substrate. By utilizing the gap among gate blocks in the first transistor unit, the transmittance can be increased and the sealant tends to easily harden.

In an embodiment, the sealant covers the gap.

In an embodiment, the sealant is cured by illuminating light.

In an embodiment, the gate driving circuit further comprises a plurality of signal lines disposed on the first substrate; at least one of the plurality of signal lines comprises at least a void, and the void is covered by the sealant.

In an embodiment, the gate driving circuit further comprises a second transistor unit, a third transistor unit, and a fourth transistor unit. The first transistor unit, the second transistor unit, the third transistor unit, and the fourth transistor unit are disposed along a first direction. The N1 number of gate blocks of the first transistor unit are disposed along a second direction. The second transistor unit comprises N2 number of gate blocks (N2≥2) disposed along the second direction and at least one connection portion. Each of the at least one connection portion is electrically connected to adjacent ones of the N2 number of gate blocks. The third transistor unit comprises N3 number of gate blocks (N3≥2) disposed along the second direction and at least one connection portion. Each connection portion is electrically connected to adjacent ones of the N3 number of gate blocks. The fourth transistor unit comprises N4 number of gate blocks (N4≥2) disposed along the second direction and at least one connection portion. Each of the connection portions is electrically connected to adjacent ones of the N4 number of gate blocks. The first direction is substantially perpendicular to the second direction. The gate blocks of the first transistor unit, the second transistor unit, the third transistor unit, and the fourth transistor unit together form a ⊐-shaped or a ⊏-shaped structure, wherein an indentation area of the ⊐-shaped or the ⊏-shaped structure is an area without any gate blocks and is covered by the sealant.

DETAILED DESCRIPTION OF THE PREFERRED EMBODIMENT

The gate driving circuit of the present invention includes light transmittance design in transistor units and/or signal lines to increase the quantity of transmitting light, and the sealant in the display panel can be therefore completely cured. The display panel of the present invention may adopt, but not limited to, manufacturing techniques including amorphous silicon, poly-silicon, and indium gallium zinc oxide (IGZO) manufacture processes.

Figure 1:
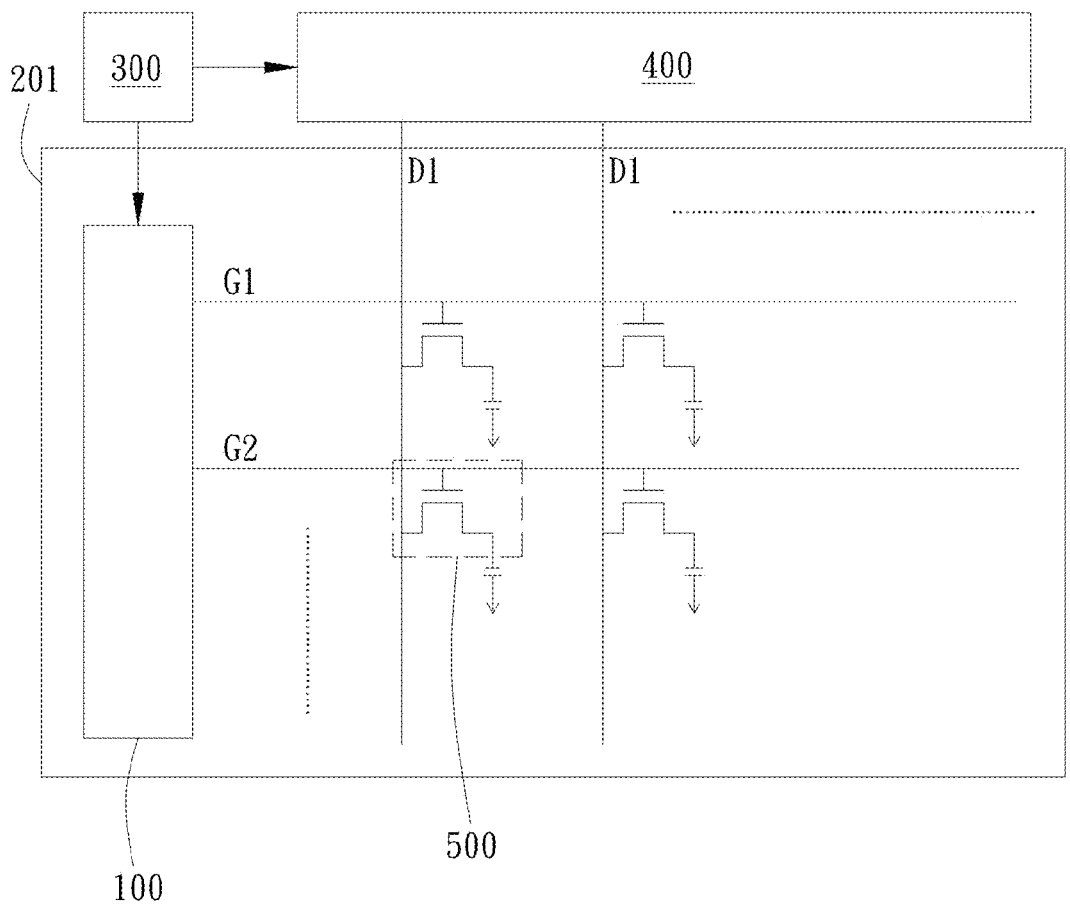
FIG. 1 illustrates a schematic view of a display device corresponding to the gate driving circuit of the present invention.

FIG. 1 shows a schematic view of an exemplary display device 10 including the gate driving circuit 100 of the present invention. As shown in FIG. 1, the display device 10 includes a gate driving circuit 100 disposed on a first substrate 201, a control unit 300, and a data driving circuit 400. The control unit 300 outputs control signals to enable the gate driving circuit 100 and the data driving circuit 400, respectively. Then gate driving signals and data signals are outputted to drive transistors 500 of the pixels through the gate lines (e.g. G1, G2) and the data lines (e.g. D1, D2) respectively.

Figure 2A:
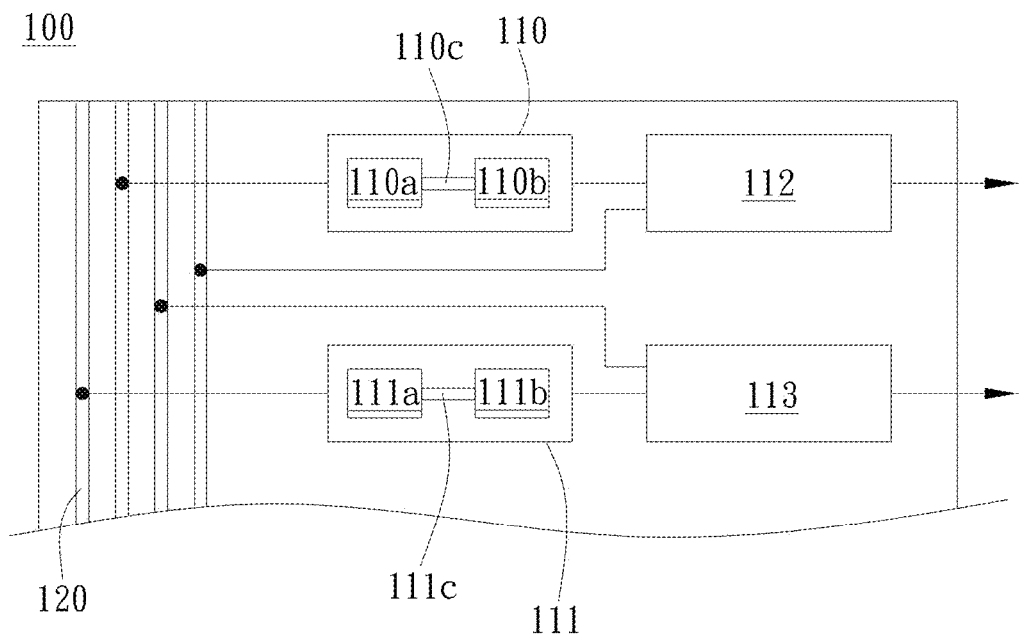
FIG. 2A illustrates a top view of an embodiment of the gate driving circuit of the present invention.

FIG. 2A shows a top view of an embodiment of the gate driving circuit of the present invention. The gate driving circuit 100 includes a plurality of transistor units 110~113 and a plurality of signal lines 120 disposed on the first substrate 201. In this embodiment, the gate driving circuit 100 includes shift registers. The circuit of shift registers includes the transistor units 110~113 and the signal lines 120. After receiving the control signals from the control unit 300 through the signal lines 120, the gate driving circuit 100 generates the gate driving signals to drive the transistors of the pixels.

Please refer to FIG. 2A, the first transistor unit 110 includes a first gate block 110a, a second gate block 110b, and a connection portion 110c. The connection portion 110c is electrically connected to the first gate block 110a and the second gate block 110b; in addition, the first gate block 110a, the second gate block 110b, and the connection portion 110c are formed with the same material in the same manufacture process. For example, in this embodiment, a metal layer is formed on the first substrate 201, and parts of the metal layer are then removed during photolithography and etching processes to simultaneously form the first gate block 110a, the second gate block 110b, and the connection portion 110c, i.e. the first gate block 110a, the second gate block 110b, and the connection portion 110c are all in the same layer. Besides, the first gate block 110a, the second gate block 110b, the connection portion 110c, and the gates of the transistors 500 of the pixels shown in FIG. 1 can be also simultaneously formed in the same manufacturing process. However, the materials and the manufacture methods of the first gate block 110a, the second gate block 110b, and the connection portion 110c are not limited thereto. Although active layers, drains, sources, drain lines, and source lines of the first transistor unit 110 are not illustrated in FIG. 2A, these elements not shown in the drawing can be easily understood and arranged by people skilled in the related art and therefore detailed description thereof is omitted.

Figure 2B:
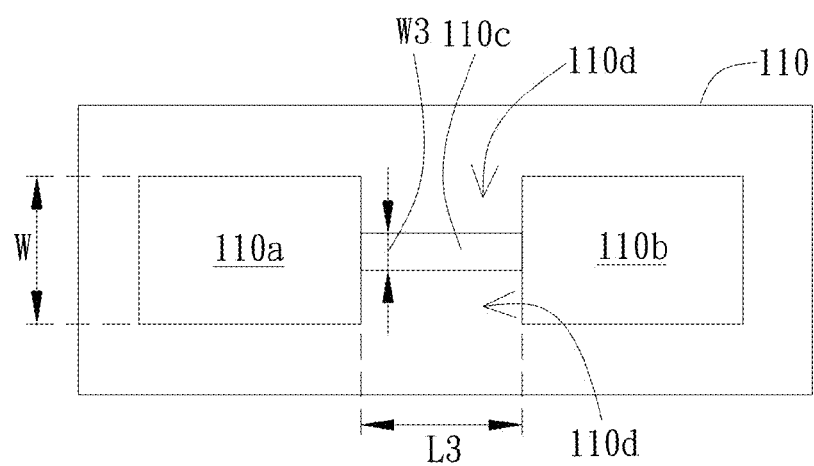
FIG. 2B illustrates an enlarged top view of the gate driving circuit.

As shown in FIG. 2B, the connection portion 110c has length (L3) and width (W3). Because the width (W3) of the connection portion 110c is shorter than the width of the first gate block 110a and also shorter than the width of the second gate block 110b, the first gate block 110a, the connection portion 110c, and the second gate block 110b together form an H-shaped structure. Conventionally, the first gate block, the second gate block, and the connection portion are usually arranged in a rectangular form (i.e. the first gate block, the second gate block, and the connection portion have the same width) for layout convenience. Because the driving ability of the transistors is related to the width of the first gate block 110a and the width of the second gate block 110b, such that when the width of the connection portion 110c of the present invention is reduced to W3, the driving ability of the transistors will not be impacted. Comparing to conventional rectangular structure where the first gate block, the second block, and the connection portion have the same width, the H-shaped structure of the transistor unit of this embodiment includes gaps 110d between the first gate block 110a and the second gate block 110b, where each gap 110d has length (L3) and width ((W−W3)/2). When light generated from the outer side of the substrate illuminates toward the sealant between the corresponding two substrates, part of the light will be blocked by the first gate block, the second gate block, and the connection portion and cannot reach the sealant between the two substrates, such that the H-shaped structure of the transistor unit of the present embodiment has a larger light transmitting area compared to the conventional rectangular structure of the transistor unit due to the gaps between adjacent gate blocks in the H-shaped structure. Comparing to the conventional design, the first transistor unit 110 including the first gate block 110a, the second gate block 110b, and the connection portion 110c has two additional light transmitting regions (i.e. the gaps 110d), and each light transmitting region has area: L3*(W−W3)/2. That is, the light transmitting gaps 110d exist between the first gate block 110a and the second gate block 110b. Similarly, the second transistor unit 111 includes a first gate block 111a, a second gate 111b, and a connection portion 111c. The connection portion 111c is located between the first gate block 111a and the second gate block 111b, and is electrically connects to the first gate block 111a and the second gate block 111b. In addition, the first gate block 111a, the second gate block 111b, and the connection portion 111c are formed with the same material in the same manufacture process. The first gate block 111a, the second gate block 111b, and the connection portion 111c adopt the same material and manufacturing process as the first gate block 110a, the second gate block 110b, and the connection portion 110c, and therefore detailed description thereof is omitted. Similarly, the first gate block 111a, the connection portion 111c, and the second gate block 111b together form an H-shaped structure, and gaps 111d exist between the first gate block 111a and the second gate block 111b.

It is noted that the amount of gate blocks is only for exemplary purpose and can be adjusted based on different circuit designs of the gate driving circuit, layout ranges, and transistor sizes. For example, the first transistor unit 110 may include N1 number of gate blocks (N1≥2) and at least one connection portion (or named as first connection portion), each of the at least one connection portion is located between adjacent ones of the N1 number of gate blocks (e.g. the first connection portion is located between a $(i-1)^{th}$ gate block and a $(i)^{th}$ gate block (2≤i≤N1)) and is electrically connected thereto; the second transistor unit 111 may include N2 number of gate blocks (N2≥2) and at least one connection portion (or named as second connection portion), each connection portion is located between adjacent ones of the N2 number of gate blocks (e.g. the second connection portion is located between a $(j-1)^{th}$ gate block and a $(j)^{th}$ gate block (2≤j≤N2)) and is electrically connected thereto.

Besides, in this embodiment, the first transistor unit 110 may include two transistors while the gate of each transistor is electrically connected to each other, wherein the layout of the gate of one transistor is the first gate block 110a, and the layout of the gate of the other transistor is the second gate block 110b. The gates of these two transistors are electrically connected by the connection portion 110c. In some embodiments, the first transistor unit 110 may be a single transistor, and the layout of the gate of the single transistor is divided into the first gate block 110a and the second gate block 110b based on the demand of circuit layout, wherein drain lines (not shown) formed on the first gate block 110a and the second gate block 110b are electrically connected to each other; source lines (not shown) formed on the first gate block 110a and the second gate block 110b are electrically connected to each other. Accordingly, the amount of transistors in the first transistor unit is not limited in the present invention. For example, the first transistor unit can have two or more transistors (wherein the gate of each transistor is connected to each other), a single transistor (divided into a plurality of gate blocks), or the combination mentioned above.

Figure 2C:
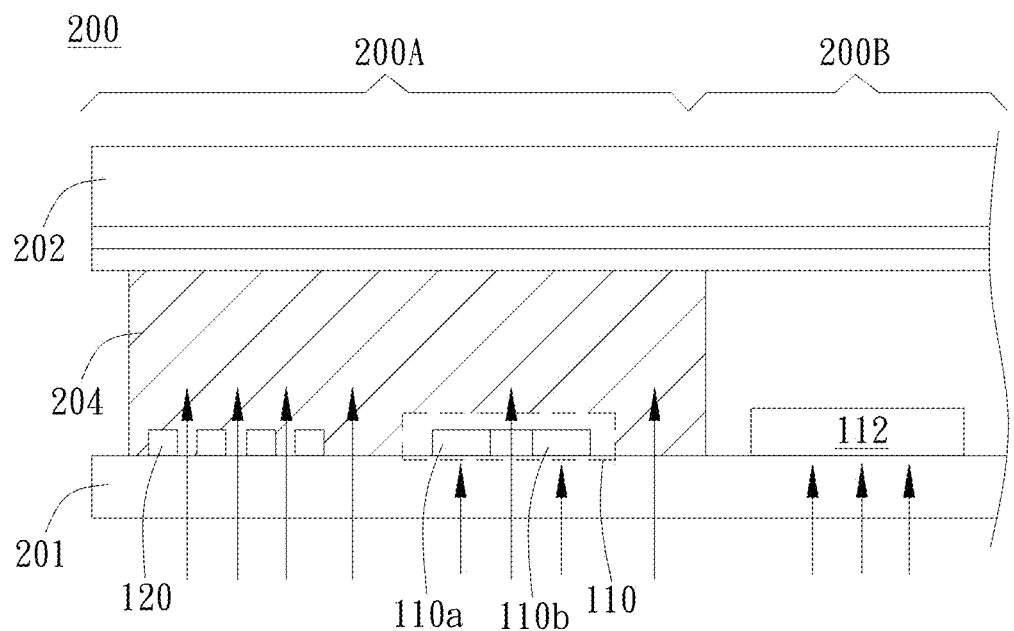
FIG. 2C illustrates a cross-sectional view of an embodiment of the display panel of the present invention.

Please further refer to the cross-sectional view of FIG. 2C. As shown in FIG. 2C, the transistor units 110, 112 and the signal lines 120 are disposed on the first substrate 201 of the display panel 200, and the second substrate 202 is disposed opposite to the first substrate 201. In this embodiment, the first substrate 201 is a thin-film transistor array substrate while the second substrate 202 is a color filter substrate. The sealant 204 is formed between the first substrate 201 and the second substrate 202 of the display panel 200. The display panel 200 has a covered area 200A and a non-covered area 200B defined by the location and area of the sealant 204. In this embodiment, the gate driving circuit 100 is partially covered by the sealant 204. As shown in FIG. 2C, the signal lines 120 and the first transistor unit 110 are located in the covered area 200A, and the third transistor unit 112 is located in the non-covered area 200B. During the sealant 204 curing process, when light generated from an outer side of the first substrate 201 illuminates toward the sealant 204 inside the display panel 200, light passes through the first substrate 201 and reach the sealant 204 via the spaces among the signal lines 120, between the signal lines 120 and the first transistor unit 110, and between the first transistor unit 110 and the third transistor unit 112 to cure the sealant 204. In addition, light also passes through the first substrate 201 and reach the sealant 204 via the gaps 110d between the first gate block 110a and the second gate block 110b to cure the sealant 204. It is noted that although the second transistor unit 111 and the fourth transistor unit 113 are not shown in the profile of FIG. 2C, however, it can be understood that the second transistor unit 111 is located in the covered area 200A, and the fourth transistor unit 113 is located in the non-covered area 200B by referencing FIG. 2A, and therefore detailed description thereof is omitted. The length and the width of each gap 110d are preferably between 10 μm and 100 μm to provide sufficient light for completely curing the sealant 204. By this design, the sealant can be easily cured and light transmittance can be increased because of the gaps between gate blocks of the transistor unit.

It is noted that although two gaps 110 with the same width and the same length are formed between the first gate block 110a and the second gate block 110b in the H-shaped structure, but the invention is not limited thereto. For example, the connection portion 110c shown in FIG. 2A can be moved upward or downward so that the two gaps have different areas. Besides, the connection portion 110c can be moved to align with the upper edge of the first gate block 110a and the upper edge of the second gate block 110b to form a ⊓-shaped structure having a gap between the first gate block 110a and the second gate block 110b. Alternatively, the connection portion 110c can be moved to align with the lower edge of the first gate block 110a and the lower edge of the second gate block 110b to form a ⊔-shaped structure having a gap between the first gate block 110a and the second gate block 110b. In other words, as long as the connection portion 110c is disposed between the first gate block 110a and the second gate block 110b, and is electrically connected to the first gate block 110a and the second gate block 110b, the position, shape, width of the connection portion 110c can be adjusted to form the gap (or gaps) between the first gate block 110a and the second gate block 110b based on the layout arrangement of the gate driving circuit 110.

Figure 3A:
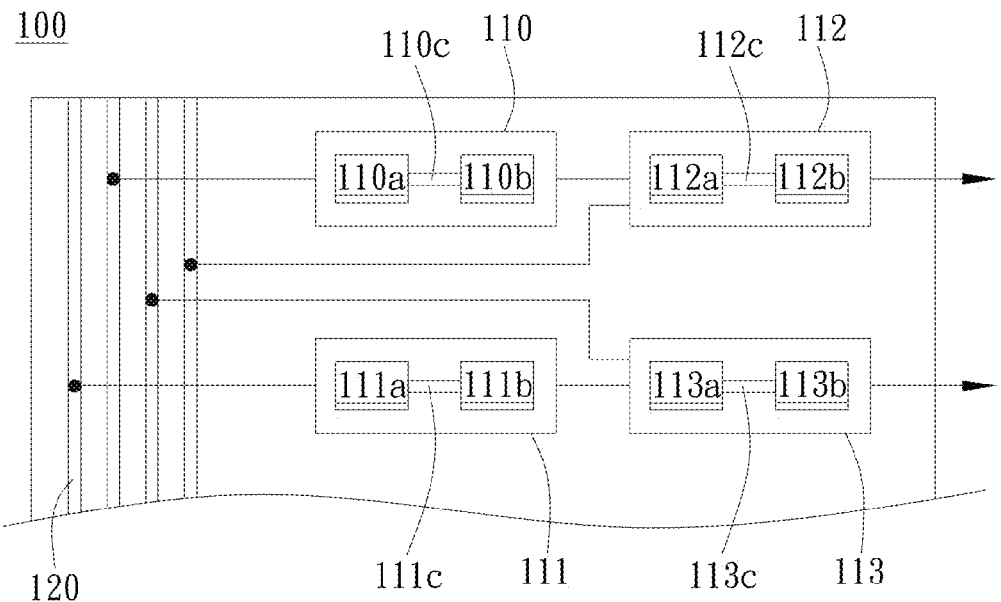
FIG. 3A illustrates a top view of another embodiment of the gate driving circuit of the present invention.
Figure 3B:
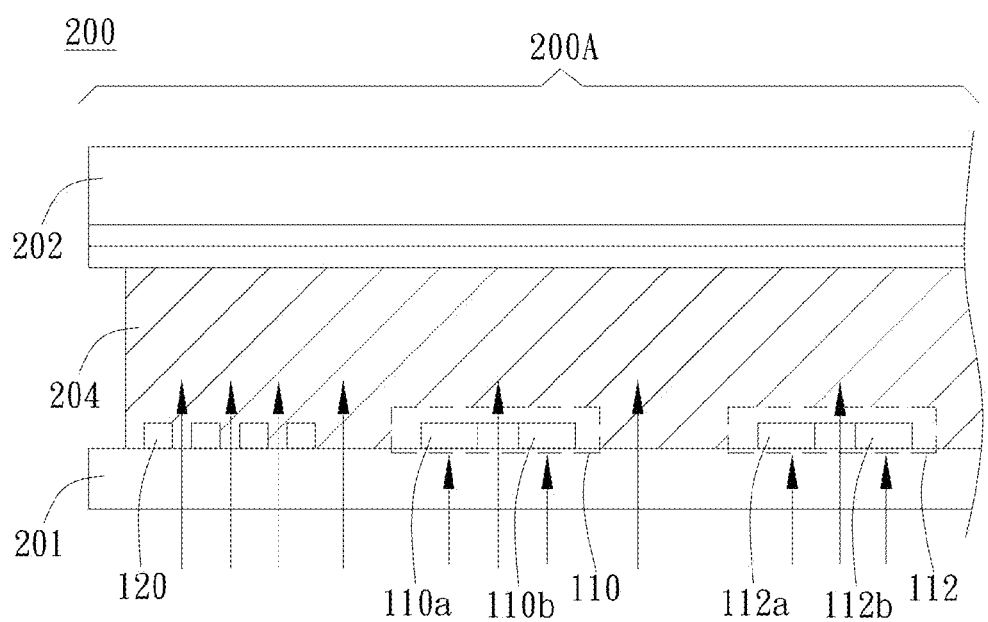
FIG. 3B illustrates a cross-sectional view of another embodiment of the display panel of the present invention.

FIG. 3A shows a top view of another embodiment of the gate driving circuit 100 of the present invention. As shown in FIG. 3A, in addition to the first transistor unit 110 and the second transistor unit 111, the third transistor unit 112 also includes a first gate block 112a, a second gate block 112b, and a connection portion 112c. The connection portion 112c is electrically connected to the first gate block 112a and the second gate block 112b. The fourth transistor unit 113 includes a first gate block 113a, a second gate block 113b, and a connection portion 113c. The connection portion 113c is electrically connected to the first gate block 113a and the second gate block 113b. Please further refer to the cross-sectional view shown in FIG. 3B. The difference between the embodiment shown in FIG. 3B and the previous embodiment is that the gate driving circuit shown in FIG. 3B is fully covered by the sealant 204. As shown in FG. 3B, the signal lines 120, the first transistor unit 110 and the third transistor unit 112 are located in the covered area 200A. As such, when light generated from the outer side of the first substrate 201 illuminates the sealant 204 inside the display panel 200, the light passes through the first substrate 201 and reach the sealant 204 via the space among the signal lines 120, between the signal lines 120 and the first transistor unit 110, between the first transistor unit 110 and the third transistor unit 112, via the gap between the first gate block 110a and the second gate block 110b of the first transistor unit 110, and via the gap between the first gate block 110a and the second gate block 110b of the third transistor unit 112 to cure the sealant 204. In other words, the structure of the transistor units can be adjusted based on the location and area of the sealant, so that the sealant can be cured more easily and the light transmittance can be increased because of the gaps among each gate blocks of the transistor unit. Similarly, although the second transistor unit 111 and the fourth transistor unit 113 are not shown in the profile of FIG. 2C, however, it can be understood that the second transistor unit 111 and the fourth transistor unit 113 are located in the covered area 200A by referencing FIG. 3A, and therefore detailed description thereof is omitted.

It is noted that the signal lines shown in FIG. 2A and FIG. 3A extend along a first direction, and the connection portions 110c, 111c, 112c, 113c extend along a second direction. The first direction is substantially perpendicular to the second direction, but the invention is not limited thereto. The extension direction of the signal lines and the connection portions can be adjusted according to the design of the gate driving circuit and circuit layout.

Figure 4A:
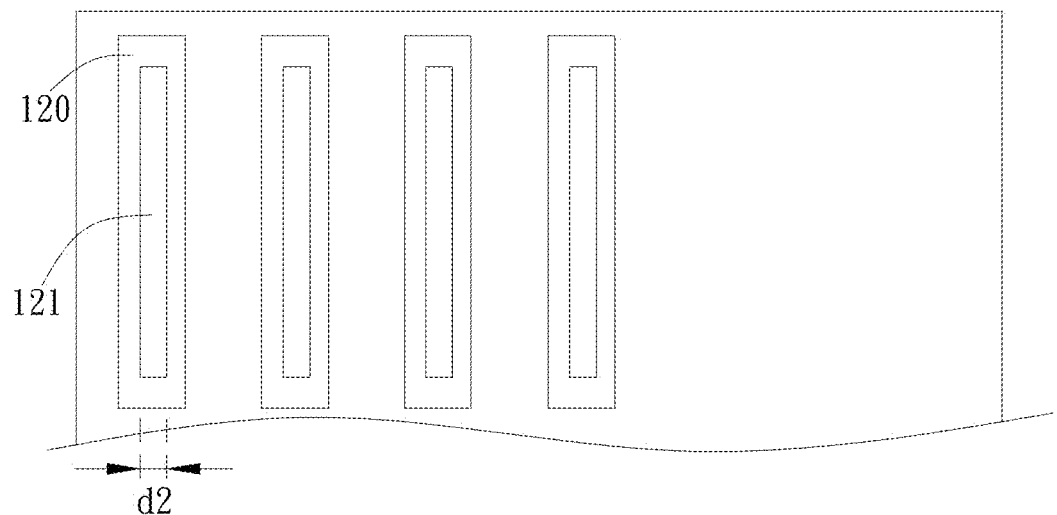
FIG. 4A illustrates a top view of another embodiment of the gate driving circuit of the present invention.
Figure 4B:
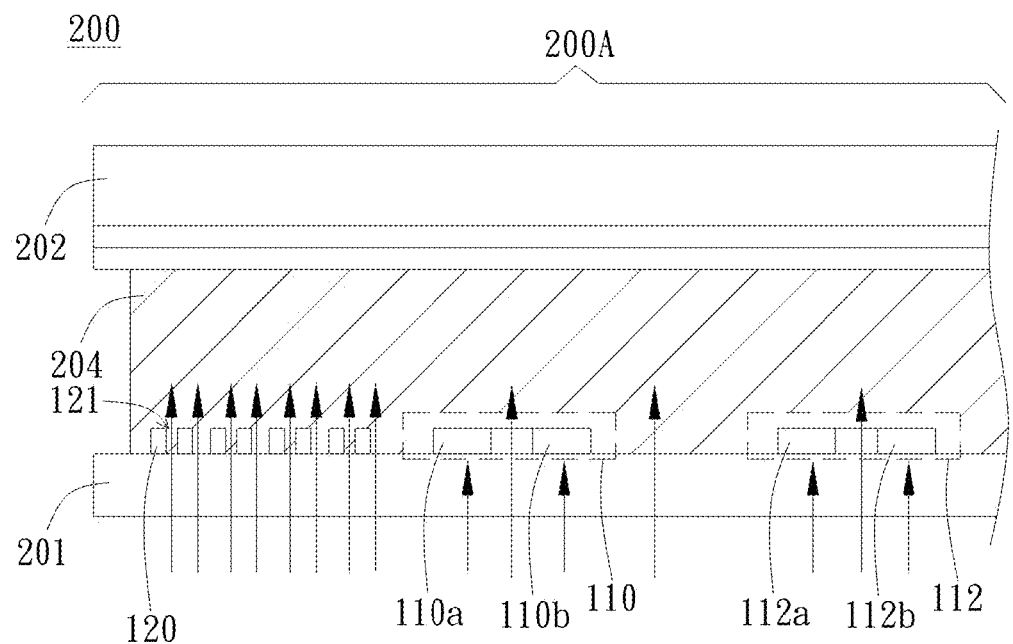
FIG. 4B illustrates a cross-sectional view of another embodiment of the display panel of the present invention.

FIG. 4A and FIG. 4B respectively show a top view and a cross-sectional view of another embodiment of the gate driving circuit 100. An enlarged view of the gate driving circuit is shown in FIG. 4A, where the signal lines 120 have a void 12. The void 121 is strip-shaped and extends along the long side of the signal lines 120. It is noted that although the transistor units 110~113 are not shown in FIG. 4A, the related arrangement of these elements can be understood by referencing descriptions in FIG. 2A and FIG. 3A, and therefore detailed description thereof is omitted. Next, please refer to FIG. 4B, as shown in FIG. 4B, the first transistor unit 110 and the third transistor unit 112 of the gate driving circuit as well as the signal lines 120 are covered by the sealant 204. Comparing to the embodiment shown in FIG. 3B, the present embodiment also allows the light to pass through the void 121 of the signal lines 120 to reach the sealant 204 in addition to the space among the signal lines 120, between the signal lines 120 and the first transistor unit 110, between the first transistor unit 110 and the third transistor unit 112, the gap between the first gate block 110a and the second gate block 110b of the first transistor unit 110, the gap between the first gate block 110a and the second gate block 110b of the third transistor unit 112. In other words, in addition to adjusting the structure of transistor units based on the location and area of the sealant, the layout of the signal lines can also be adjusted to allow the transmission of the light through the void of the signal lines. The width (d2) of the void 121 is preferably between 5 μm and 30 μm to provide sufficient light for completely curing the sealant. By this design, the sealant can be easily cured, and light transmittance can be increased because of the gaps between gate blocks of the transistor unit and the void of the signal lines. Similarly, although the second transistor unit 111 and the fourth transistor unit 113 are not shown in FIG. 4B, the second transistor unit 111 and the fourth transistor unit 113 are also preferably located in the covered area 200A, and therefore detailed description thereof is omitted.

It is noted that the embodiment shown in FIG. 4B utilizes the gap between each gate blocks in the transistor and also utilizes the void in the signal lines to increase light transmittance, but the invention is not limited thereto. For example, if the sealant covers the signal lines 120 only, then only the voids 121 formed in the signal lines 120 are required to increase light transmittance for curing the sealant. Therefore the gaps between each gate blocks and the voids in the signal lines can be formed selectively based on the location and area of the sealant.

Figure 5A:
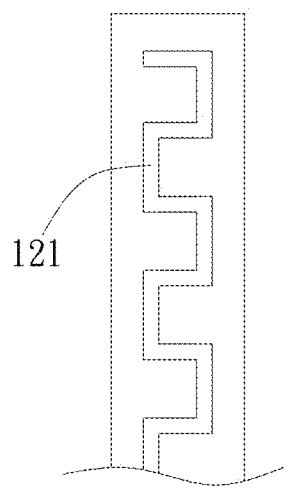
FIG. 5A and FIG. 5B illustrate schematic views of different embodiments of the signal line.
Figure 5B:
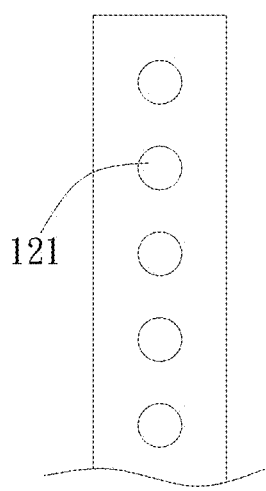

Besides, for different embodiments of signal lines shown in FIG. 5A and FIG. 5B, respectively, the void 121 can be adjusted in different forms based on different demands. In FIG. 5A, the void 121 on the signal line 120 has a shape of a zigzag and extends along the long side of the signal line 120 to further increase the light transmitting area. In FIG. 5B, the void 121 has a shape of a circle and the voids 121 are disposed along the long side of the signal line. In other embodiment, the amount and the size of the circle can be adjusted based on the demand of the curing process. By this design, the light transmittance and the yield rate of the gate driving circuit can be increased, and the problem of insufficient light transmittance that shortens the lifetime of the display panel can be avoided.

It is noted that the amount and the size of the void 121 on the signal line 120 of the invention are not limited to the aforementioned examples shown in FIG. 4A, FIG. 5A, and FIG. 5B. The amount and the size of the void 121 on the signal line 120 can be adjusted on demand as long as the signal transmission and reliability of the signal line are not impacted. For example, the void 121 may be shaped in a rectangular hole, multiple parallel strips, multiple parallel zigzags, or an irregular formed hollow region. Although the voids 121 are formed on each signal lines 120 as shown in FIG. 4A, however, the arrangement of the signal lines can be modified as at least one void being formed on at least one of the signal lines corresponding to the sealant. Besides, although the voids 121 in this embodiment are formed on the signal lines that receive the control signal generated from the control unit 300, however, the voids can be formed on the drain lines or source lines, or formed on the connection line between transistor units to increase light transmittance for curing the sealant.

Figure 6A:
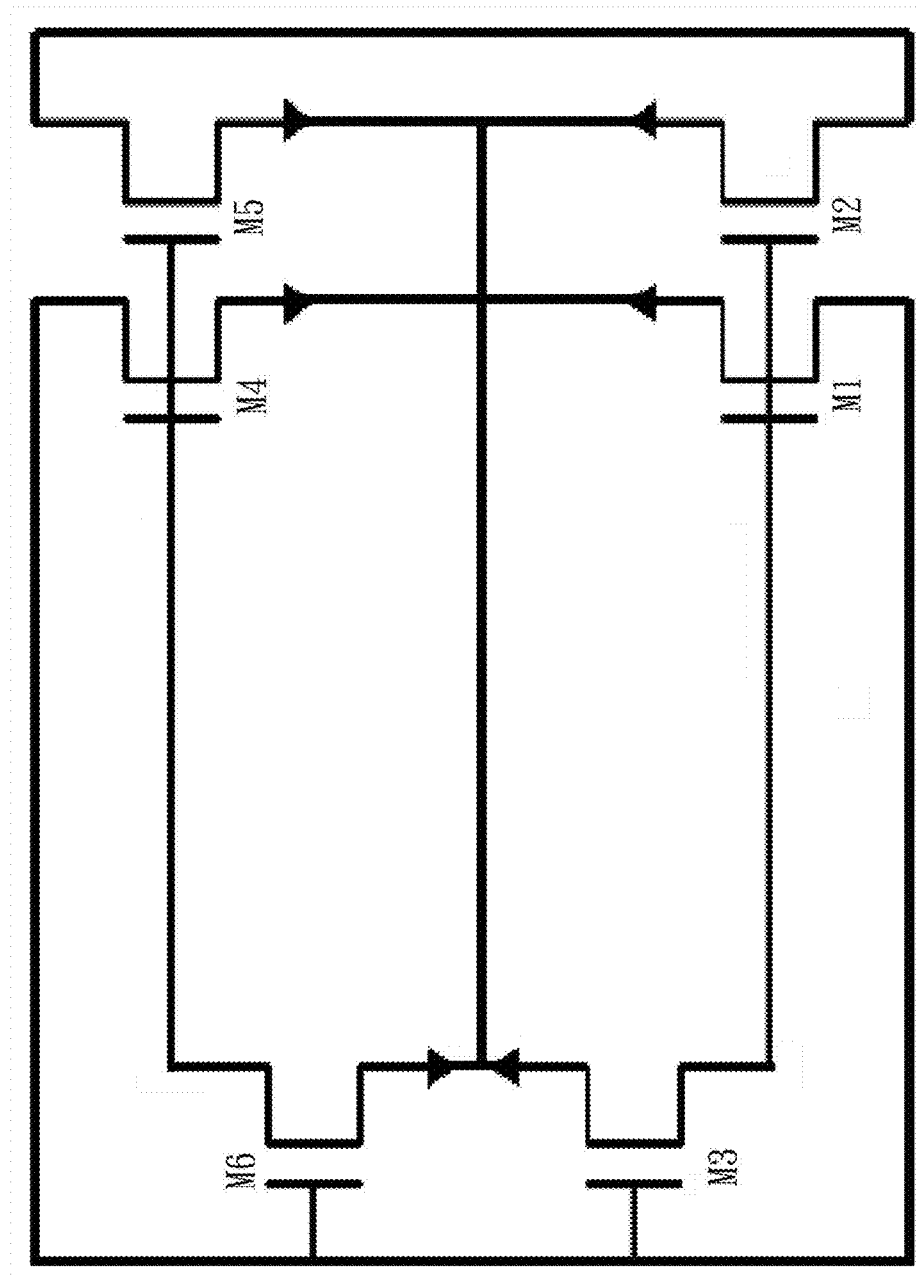
FIG. 6A illustrates a partial circuit of the gate driving circuit of the present invention.
Figure 6B:
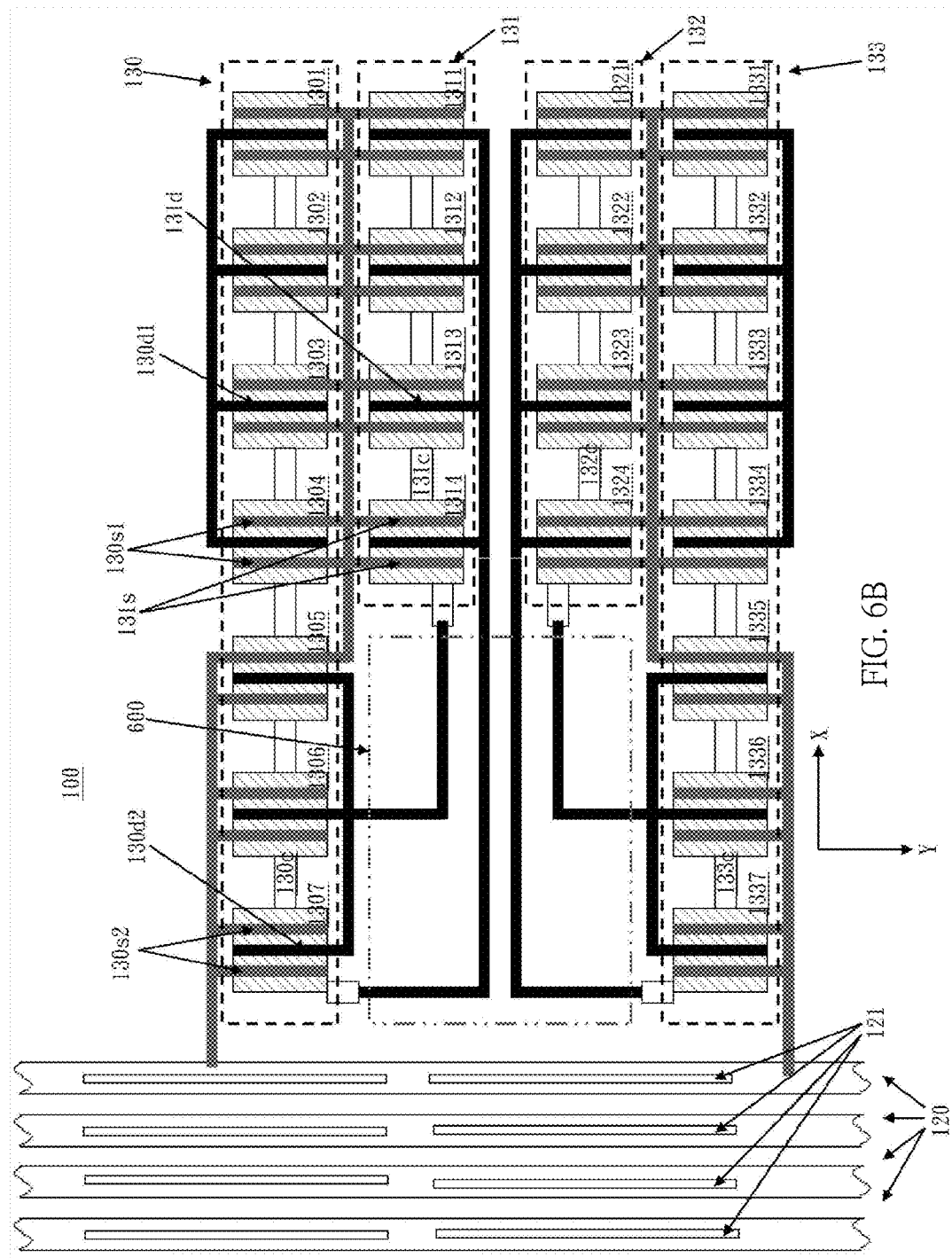
FIG. 6B illustrates a top view of another embodiment of the gate driving circuit of the present invention.

Please refer to FIG. 6A and FIG. 6B. FIG. 6A exemplarily shows a portion of the gate driving circuit of the present invention, which includes a first transistor M1, a second transistor M2, a third transistor M3, a fourth transistor M4, a fifth transistor M5, and a sixth transistor M6. The gate of the first transistor M1 is electrically connected to the gate of the second transistor M2 while the gate of the fourth transistor M4 is electrically connected to the gate of the fifth transistor M5. The sources of transistors M1~M6 are connected to each other.

FIG. 6B shows a top view of another embodiment of the gate driving circuit 100 of the present invention. As shown in FIG. 6B, the gate driving circuit 100 includes a plurality of transistor units 130~133 and a plurality of signal lines 120. In this embodiment, the gate driving circuit 100 includes at least one shift register. The circuit of the shift register includes the transistor units 130~133 and the signal lines 120. After the signal lines 120 in the gate driving circuit 100 receives the control signal from the control unit, the gate driving circuit 100 generates the gate driving signal to drive the transistors of the pixels.

As shown in FIG. 6B, the first transistor unit 130 includes first~seventh gate blocks 1301~1307 and six connection portions 130c (or named as first connection portion), each connection portion 130c is located between adjacent ones of the seven gate blocks (e.g. the first connection portion is located between the $(i-1)^{th}$ gate block and the $(i)^{th}$ gate block ($2 \le i \le 7$)) and is electrically connected thereto. The second transistor unit 131 includes first~fourth gate blocks 1311~1314 and three connection portions 131c (or named as second connection portion), each connection portion 131c is located between adjacent ones of the four gate blocks (e.g. the second connection portion is located between the $(j-1)^{th}$ gate block and the $(j)^{th}$ gate block ($2 \le j \le 4$)) and is electrically connected thereto. The third transistor unit 132 includes first~fourth gate blocks 1321~1324 and three connection portions 132c (or named as third connection portion), each connection portion 132c is located between adjacent ones of the four gate blocks (e.g. the third connection portion is located between the $(k-1)^{th}$ gate block and the $(k)^{th}$ gate block ($2 \le k \le 4$)) and is electrically connected thereto. The fourth transistor unit 133 includes first~seventh gate blocks 1331~1337 and six connection portions 133c (or named as fourth connection portion), each connection portion 133c is located between adjacent ones of the seven gate blocks (e.g. the fourth connection portion is located between the $(m-1)^{th}$ gate block and the $(m)^{th}$ gate block ($2 \le m \le 7$)) and is electrically connected thereto. Please refer to FIG. 6A and FIG. 6B, the first transistor unit 130 includes a first transistor (M1) and a second transistor (M2) electrically connected to each other via their gates, wherein the second transistor (M2) has first~fourth gate blocks 1301~1304 connected in parallel (the term "connected in parallel" mentioned above may be referred to, but not limited to, the meaning that the drain lines 130d1 of the first gate block 1301, the second gate block 1302, the third gate block 1303, and the fourth gate block 1304 are electrically connected to each other; the sources lines 130s1 of the first gate block 1301, the second gate block 1302, the third gate block 1303, and the fourth gate block 1304 are electrically connected to each other). The first transistor (M1) has fifth~seventh gate blocks 1305~1307 connected in parallel (the term "connected in parallel" mentioned above may be referred to, but not limited to, the meaning that the drain lines 130d2 of the fifth gate block 1305, the sixth gate block 1306, and the seventh gate block 1307 are electrically connected to each other; the sources lines 130s2 of the fifth gate block 1305, the sixth gate block 1306, and the seventh gate block 1307 are electrically connected to each other). The third transistor (M3) has first~fourth gate blocks 1311~1314 connected in parallel (the term "connected in parallel" mentioned above may be referred to, but not limited to, the meaning that the drain lines 131d1 of the first gate block 1311, the second gate block 1312, the third gate block 1313, and the fourth gate block 1314 are electrically connected to each other; the sources lines 131s1 of the first gate block 1311, the second gate block 1312, the third gate block 1313, and the fourth gate block 1314 are electrically connected to each other). As shown in FIG. 6A and FIG. 6B, because the source of the second transistor (M2) is electrically connected to the source of the third transistor (M3), the first~fourth gate blocks 1311~1314 of the second transistor unit 131 can be disposed below the first~fourth gate blocks 1301~1304 of the first transistor unit 130, so that the sources (not shown) on the first~fourth gate blocks 1311~1314 may align with the sources (not shown) on the first~fourth gate blocks 1301~1304 along x-axis (the term "align . . . along x-axis" may be referred to, but not limited to, the meaning that the sources on the first~fourth gate blocks 1301~1304 and the sources on the first~fourth gate blocks 1311~1314 are arranged along the x-axis, while the sources on the first~fourth gate blocks 1301~1304 vertically align with the sources on the first~fourth gate blocks 1311~1314, respectively). Therefore, the source lines 131s on the first~fourth gate blocks 1311~1314 and the source lines 130s1 on the first~fourth gate blocks 1301~1304 can be formed by a plurality of metal wires extending along the y-axis. For the plurality of metal wires extending along the y-axis, each metal wire electrically connects to the sources on the first~fourth gate blocks 1311~1314 and the sources on the first~fourth gate blocks 1301~1304. As such, it is not necessary to bend the source lines to electrically connect to the source of the second transistor (M2) and the source of the third transistor (M3). Therefore, the circuit layout of the gate driving circuit 100 can be simplified, and layout area can be reduced.

Similarly, the fourth transistor unit 133 includes a fourth transistor (M4) and a fifth transistor (M5) electrically connected to each other via their gates, wherein the fifth transistor (M5) has first~fourth gate blocks 1331~1334 connected in parallel (the term "connected in parallel" mentioned above may be referred to, but not limited to, the meaning that the drain lines of the first gate block 1331, the second gate block 1332, the third gate block 1333, and the fourth gate block 1334 are electrically connected to each other; the sources lines of the first gate block 1331, the second gate block 1332, the third gate block 1333, and the fourth gate block 1334 are electrically connected to each other). The fourth transistor (M4) has fifth~seventh gate blocks 1335~1337 connected in parallel (the term "connected in parallel" mentioned above may be referred to, but not limited to, the meaning that the drain lines of the fifth gate block 1335, the sixth gate block 1336, and the seventh gate block 1337 are electrically connected to each other; the sources lines of the fifth gate block 1335, the sixth gate block 1336, and the seventh gate block 1337 are electrically connected to each other). The sixth transistor (M6) has first~fourth gate blocks 1321~1324 connected in parallel (the term "connected in parallel" mentioned above may be referred to, but not limited to, the meaning that the drain lines of the first gate block 1321, the second gate block 1322, the third gate block 1323, and the fourth gate block 1324 are electrically connected to each other; the sources lines of the first gate block 1321, the second gate block 1322, the third gate block 1323, and the fourth gate block 1324 are electrically connected to each other). As shown in FIG. 6A and FIG. 6B, because the source of the fifth transistor (M5) is electrically connected to the source of the sixth transistor (M6), the first~fourth gate blocks 1331~1334 of the fourth transistor unit 133 can be disposed below the first~fourth gate blocks 1321~1324 of the third transistor unit 132, so that the sources (not shown) on the gate blocks 1331~1334 may align with the sources (not shown) on the gate blocks 1321~1324 along the x-axis. Therefore, the source lines on the first~fourth gate blocks 1321~1324 and the source lines on the first~fourth gate blocks 1331~1334 can be formed by the plurality of metal wires extending along the y-axis. For the plurality of metal wires extending along the y-axis, each metal wire electrically connects to the sources on the first~fourth gate blocks 1321~1324 and the sources on the first~fourth gate blocks 1331~1334.

As shown in FIG. 6B, the first transistor unit 130, the second transistor unit 131, the third transistor unit 132, and the fourth transistor unit 133 are disposed along the y-axis as described above. Because the first transistor unit 130 and the fourth transistor unit 133 respectively include seven gate blocks along the x-axis, the second transistor unit 131 and the third transistor unit 132 respectively include four gate blocks along x-axis, and first~fourth gate blocks 1311~1314 of the transistor unit 131, first~fourth gate blocks 1321~1324 of the transistor unit 132, the first~fourth gate blocks 1301~1304 of the first transistor unit 130 at the right most position, and the four gate blocks 1331~1334 of the fourth transistor unit 133 at the right most position are aligned with each other along the x-axis; therefore, the gate blocks of the transistor units 130~133 together form a ⊐-shaped structure, and the breach of the ⊐-shaped structure faces toward left side (i.e. the breach faces toward an edge of the first substrate of the display panel 200). Therefore, the gate driving circuit 100 can have an area without any gate blocks by forming ⊐-shaped structure. That is, an indentation area of the ⊐-shaped structure is formed as an area 600 without any gate blocks. As shown in FIG. 6B, although a few of connection lines are disposed in the area 600 without any gate blocks in this embodiment, the area of the connection lines are far smaller than the area of the gate block, so that the layout of this embodiment increases the light transmittance of the gate driving circuit 100 compared to conventional gate driving circuit layout. Besides, the void mentioned above can be formed on the connection lines disposed in the area 600 without any gate blocks to further increase light transmittance. Because the sealant usually covers the signal lines and at least part of the gate driving circuit 100, the light transmittance of the gate driving circuit can be increased for a better sealant curing result by disposing the area 600 without any gate block in the sealant coverage area. Besides, FIG. 6B only illustrates a part of the gate driving circuit 100 corresponding to one row of pixels. It is appreciated that the gate driving circuit 100 corresponding to each row of pixels includes one area 600 without any gate blocks. Therefore, the gate driving circuit 100 has M areas 600 without any gate blocks if the gate driving circuit 100 is designed to drive M rows of pixels, and the adjacent areas 600 without any gate blocks may have the same interval. With this exemplary layout, when light generated from the outer side of the substrate illuminates toward the sealant, the light will be allowed to pass through the substrate and reach the sealant via areas without any gate blocks to evenly cure the sealant (because the areas without any gate blocks are evenly disposed on the substrate by a fixed interval), so that the sealant in the display panel can be completely cured.

Although the embodiment shown in FIG. 6B discloses that the gate blocks of the transistor units 130~133 form a ⊐-shaped structure, the gate blocks of the transistor units 130~133 may alternatively form a ⊏-shaped structure, and the breach of the ⊏-shaped structure faces toward right side (i.e. toward the center of the first substrate 201 of the display panel 200). For example, the positions of the gate blocks 1301~1304 and 1331~1334 are moved to the left side of the gate blocks 1305~1307 and 1335~1337. Besides, the gate blocks 1311~1314 and 1321~1324 are arranged to align with the gate blocks 1301~1304 and 1331~1334 along the x-axis. As such, the gate blocks of the transistor units 130~133 together form the ⊏-shaped structure. Similarly, the indentation area of the ⊏-shape structure becomes an area without any gate blocks.

It is noted that, in this embodiment, the first~fourth gate blocks 1311~1314 of the second transistor unit 131, the first~fourth gate blocks 1321~1324 of the third transistor unit 132, the first~fourth gate blocks 1301~1304 of the first transistor unit 130, and the first~fourth gate blocks 1331~1334 of the fourth transistor unit 134 are aligned with each other along the x-axis; the sources of the first~fourth gate blocks 1301~1304, the sources of the first~fourth gate blocks 1331~1334, the sources of the first~fourth gate blocks 1311~1314, and the sources of the first~fourth gate blocks 1321~1324 are aligned with each other, but the invention is not limited thereto. The light transmittance of the gate driving circuit can be increased for a better sealant curing if the gate blocks of the transistor units of the gate driving circuit 100 are arranged as the ⊐-shaped or the ⊏-shaped structure, and the indentation area of the ⊐-shaped or the ⊏-shaped structure is the area without any gate blocks and is within the coverage area of the sealant.

Besides, as shown in FIG. 6B, the gate blocks are arranged as the ⊐-shaped structure adjacent to the signal lines 120, but the invention is not limited thereto. In the other embodiment, Additional transistor or transistor unit can be formed within the space between the gate blocks arranged as the ⊐-shaped (or the ⊏-shaped) structure and the signal lines 120 based on the demand of the circuit or layout of the gate driving circuit 100. The light transmittance of the gate driving circuit can be increased for better sealant curing result as long as the area without any gate blocks is located within the coverage area of the sealant. For example, please refer to FIG. 6C, transistors 134~137 are disposed within the space between the gate blocks arranged as the ⊐-shaped structure and the signal lines 120. By this arrangement, the area 600 without any gate blocks is formed within the space between the transistors 134~137 and the gate blocks arranged as the ⊐-shaped structure (the transistor units 130~133), and the area 600 without any gate blocks is encircled by the ⊐-shaped structure and the transistors 134~137.

Figure 6C:
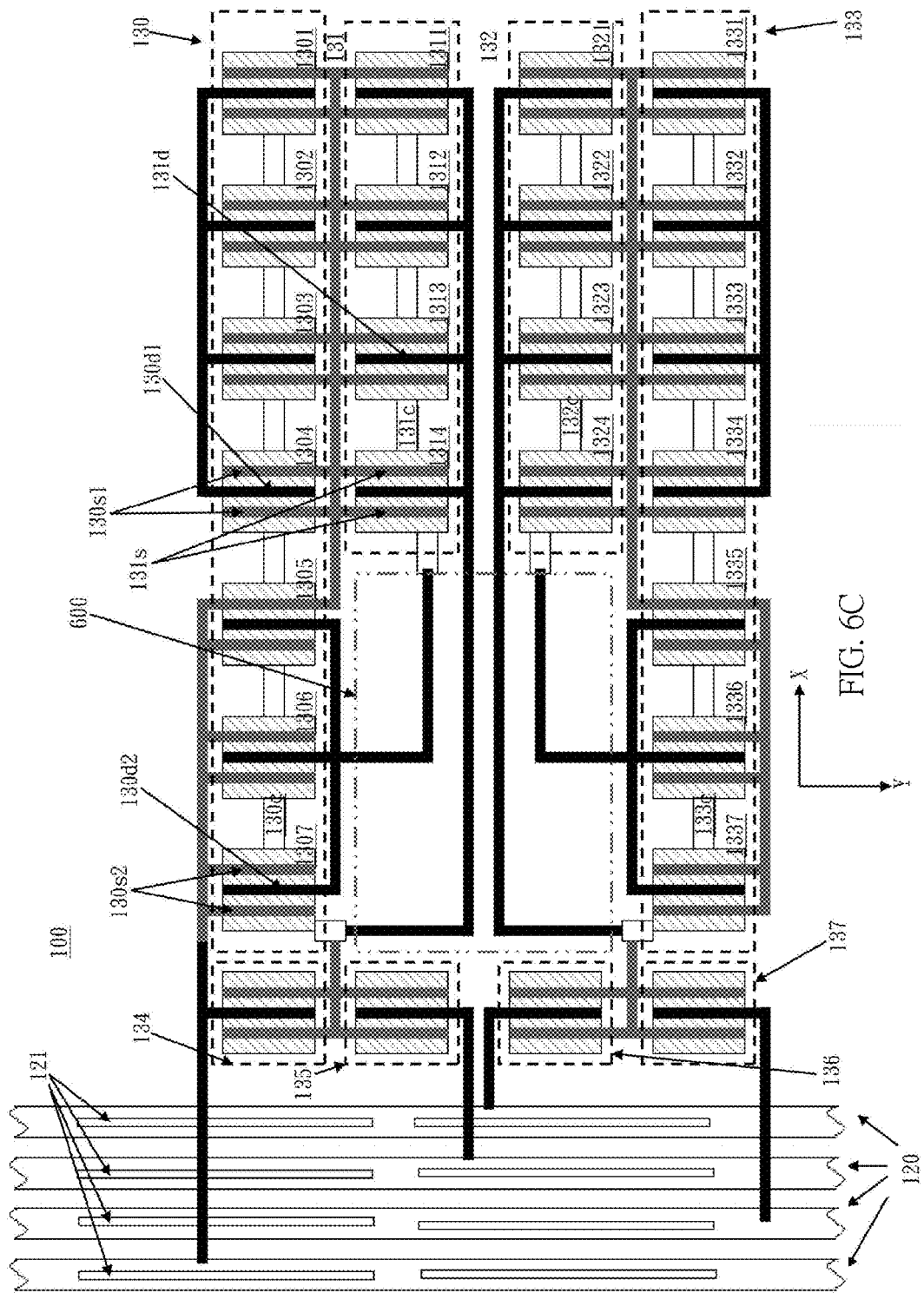
FIG. 6C illustrates a top view of another embodiment of the gate driving circuit of the present invention.

It is noted that although FIG. 6B and FIG. 6C illustrate gaps being formed between gate blocks of transistor units 130~133, and the void is formed on the signal lines 120. It is appreciated that the arrangement of gate blocks can be modified as the ⊐-shaped or the ⊏-shaped structure based on different demands of circuit layout, while the signal lines may be formed without any voids, or the gate blocks may be formed without any gaps.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A gate driving circuit disposed on a first substrate, the gate driving circuit comprising:
   a first transistor unit disposed on the first substrate, the first transistor unit comprising N1 number of gate blocks (N1≥2) and at least one connection portion, wherein each of the at least one connection portion is located between adjacent ones of the gate blocks and is electrically connected to the adjacent ones of the gate blocks, the at least one connection portion and the gate blocks are in the same layer, and at least one gap is formed between the adjacent ones of the gate blocks.

2. The gate driving circuit of claim 1, wherein the adjacent ones of the gate blocks and the at least one connection portion electrically connected thereto form a H-shaped, a ⊓-shaped, or a ⊔-shaped structure.

3. The gate driving circuit of claim 1, wherein the number of the at least one gap between the adjacent ones of the gate blocks is two, and the two gaps are located at two sides of the at least one connection portion.

4. The gate driving circuit of claim 1, wherein the at least one connection portion and the gate blocks are in the same metal layer.

5. The gate driving circuit of claim 1, wherein a plurality of transistors of pixels are disposed on the first substrate, the gates of the plurality of transistors of pixels are in the same layer as the at least one connection portion and the gate blocks.

6. The gate driving circuit of claim 1, wherein the first transistor unit further comprises a plurality of drain lines and a plurality of source lines formed on the gate blocks, the plurality of drain lines are electrically connected to each other and the plurality of source lines are electrically connected to each other.

7. The gate driving circuit of claim 1, further comprising a plurality of signal lines disposed on the first substrate, at least one void being formed on at least one of the plurality of signal lines.

8. The gate driving circuit of claim 7, wherein the at least one void has a shape of a stripe, a zigzag, or a circle.

9. The gate driving circuit of claim 7, wherein the plurality of signal lines extends along a first direction; a first connection portion extends along a second direction; and the first direction is substantially perpendicular to the second direction.

10. The gate driving circuit of claim 1, further comprising: a second transistor unit, a third transistor unit, and a fourth transistor unit, wherein the first transistor unit, the second transistor unit, the third transistor unit, and the fourth transistor unit are disposed along a first direction; the N1 number of gate blocks of the first transistor unit are disposed along a second direction; the second transistor unit comprises N2 number of gate blocks (N2≥2) disposed along the second direction and at least one connection portion, each of the at least one connection portion of the second transistor unit is electrically connected to adjacent ones of the N2 number of gate blocks; the third transistor unit comprises N3 number of gate blocks (N3≥2) disposed along the second direction and at least one connection portion, each of the at least one connection portion of the third transistor unit is electrically connected to adjacent ones of the N3 number of gate blocks; and the fourth transistor unit comprises N4 number of gate blocks (N4≥2) disposed along the second direction and at least one connection portion, each of the at least one connection portion of the fourth transistor unit is electrically connected to adjacent ones of the N4 number of gate blocks; wherein the first direction is substantially perpendicular to the second direction, and the gate blocks of the first transistor unit, the second transistor unit, the third transistor unit, and the fourth transistor unit together form a ⊐-shaped or a ⊏-shaped structure.

11. The gate driving circuit of claim 10, wherein N1 is larger than N2, and N4 is larger than N3.

12. The gate driving circuit of claim 10, wherein an indentation area of the ⊐-shaped or the ⊏-shaped structure is an area without any gate blocks.

13. The gate driving circuit of claim 4, wherein the at least one connection portion and the gate blocks are formed by photolithography and etching processes performed on a metal layer.

14. A display panel, comprising:

a first substrate;

a gate driving circuit disposed on the first substrate, the gate driving circuit comprising: a first transistor unit disposed on the first substrate, the first transistor unit comprising N1 number of gate blocks (N1≥2) and at least one connection portion, wherein each of the at least one connection portion is located between adjacent ones of the gate blocks and is electrically connected to the adjacent ones of the gate blocks, the at least one connection portion and the gate blocks are in the same layer, and at least one gap is formed between the adjacent ones of the gate block;

a second substrate disposed corresponding to the first substrate; and a sealant disposed between the first substrate and the second substrate.

15. The display panel of claim 14, wherein the sealant covers the at least one gap.

16. The display panel of claim 14, wherein the sealant is cured by illuminating light.

17. The display panel of claim 14, wherein the gate driving circuit further comprises a plurality of signal lines disposed on the first substrate; at least one of the plurality of signal lines comprises at least a void, and the void is covered by the sealant.

18. The gate driving circuit of claim 14, the gate driving circuit further comprising: a second transistor unit, a third transistor unit, and a fourth transistor unit, wherein the first transistor unit, the second transistor unit, the third transistor unit, and the fourth transistor unit are disposed along a first direction; the N1 number of gate blocks of the first transistor unit are disposed along a second direction; the second transistor unit comprises N2 number of gate blocks (N2≥2) disposed along the second direction and at least one connection portion, each of the at least one connection portion of the second transistor unit is electrically connected to adjacent ones of the N2 number of gate blocks; the third transistor unit comprises N3 number of gate blocks (N3≥2) disposed along the second direction and at least one connection portion, each of the at least one connection portion of the third transistor unit is electrically connected to adjacent ones of the N3 number of gate blocks; and the fourth transistor unit comprises N4 number of gate blocks (N4≥2) disposed along the second direction and at least one connection portion, each of the at least one connection portion of the fourth transistor unit is electrically connected to adjacent ones of the N4 number of gate blocks, wherein the first direction is substantially perpendicular to the second direction, and the gate blocks of the first transistor unit, the second transistor unit, the third transistor unit, and the fourth transistor unit together form a ⊐-shaped or a ⊏-shaped structure, wherein an indentation area of the ⊐-shaped or the ⊏-shaped structure is an area without any gate blocks and is covered by the sealant.

* * * * *